US007267604B2

(12) United States Patent
Yoshizawa et al.

(10) Patent No.: US 7,267,604 B2
(45) Date of Patent: Sep. 11, 2007

(54) GRINDING ABRASIVE GRAINS, ABRASIVE, ABRASIVE SOLUTION, ABRASIVE SOLUTION PREPARATION METHOD, GRINDING METHOD, AND SEMICONDUCTOR DEVICE FABRICATION METHOD

(75) Inventors: Chie Yoshizawa, Yokohama (JP); Satoshi Uematsu, Hitachi (JP); Hisashi Mashiyama, Hitachinaka (JP); Takehiko Tani, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 18 days.

(21) Appl. No.: 11/071,589

(22) Filed: Mar. 4, 2005

(65) Prior Publication Data
US 2005/0205836 A1 Sep. 22, 2005

(30) Foreign Application Priority Data
Mar. 19, 2004 (JP) .............................. 2004-080756

(51) Int. Cl.
*B24D 17/00* (2006.01)
(52) U.S. Cl. ......................................... 451/41; 51/307
(58) Field of Classification Search ............... 451/41, 451/36, 53, 60; 51/307, 308, 309; 438/692
See application file for complete search history.

(56) References Cited

U.S. PATENT DOCUMENTS

| 6,398,827 | B1 | 6/2002 | Ota et al. | |
| 6,551,366 | B1* | 4/2003 | D'Souza et al. | 51/309 |
| 6,881,483 | B2* | 4/2005 | McArdle et al. | 428/403 |
| 2004/0223898 | A1* | 11/2004 | Ota et al. | 423/263 |
| 2005/0032631 | A1* | 2/2005 | Thomas | 502/80 |
| 2005/0205836 | A1* | 9/2005 | Yoshizawa et al. | 252/79.1 |

FOREIGN PATENT DOCUMENTS

| JP | 07-221059 A | 8/1995 |
| JP | 09-296161 A | 11/1997 |
| JP | 2001-011433 A | 1/2001 |
| JP | 2002-338232 A | 11/2002 |

\* cited by examiner

*Primary Examiner*—Jacob K. Ackun, Jr.
(74) *Attorney, Agent, or Firm*—Foley & Lardner LLP

(57) ABSTRACT

Abrasive grains have mainly grains with a roundness of 0.50 or more and 0.75 or less, where the roundness is defined as the ratio of the circumference of a circle having the same area as that of a grain to the perimeter of that grain. An abrasive has the abrasive grains and at least one of an oxidizer, an oxide solution, an abrasive grain dispersion agent and a basic compound. An abrasive solution has the abrasive grains and water or hydrophilic substance.

17 Claims, 9 Drawing Sheets

GRINDING ABRASIVE GRAINS, ABRASIVE, ABRASIVE SOLUTION, ABRASIVE SOLUTION PREPARATION METHOD, GRINDING METHOD, AND SEMICONDUCTOR DEVICE FABRICATION METHOD

The present application is based on Japanese patent application No. 2004-080756, the entire contents of which are incorporated herein by reference.

BACKGROUND OF THE INVENTION

1. Field of the Invention

This invention relates to grinding abrasive grains suitable for grinding semiconductor wafers such as compound semiconductor wafers (e.g., GaAs wafers), silicon wafers, etc., an abrasive containing the abrasive grains, an abrasive solution containing the abrasive grains, a method for preparing the abrasive solution, a grinding method by the abrasive solution, and a semiconductor device fabrication method using the abrasive solution.

2. Description of the Related Art

In recent years, the flatness of compound semiconductor wafers or semiconductor wafers has been strictly required with remarkable high integration and high capacity, so that still more excellent-precision machining technology has been required. In the grinding step of a wafer fabrication process, there are many problems of removing shape irregularities, removing thickness variations, removing machining strains, adjusting flatness, etc.

In general, combined chemical and mechanical grinding is applied to the grinding step, and abrasive is a consumable item which largely affects wafer quality. In the chemical and mechanical grinding of semiconductor wafers such as compound semiconductor wafers, silicon wafers, etc., it is important to balance a chemical factor which serves to reduce machining strains and a mechanical factor which affects flatness and surface quality. Both chemical and mechanical factors are largely related to grinding characteristics of abrasive.

In other words, the grinding step of semiconductor wafers such as compound semiconductor wafers, silicon wafers, etc., comprises the primary step of forming an oxide film on a surface, the secondary step of grinding the oxide film by abrasive grains, and the third step of dissolving the ground oxide to increase grinding speed. The primary and third steps affect a chemical factor, and the secondary step affects a mechanical factor. Of these steps, the secondary step of grinding the oxide film by abrasive grains largely affects a wafer surface state, shape and flatness, and determines wafer quality. Abrasive grain form affects all grinding characteristics including grinding speed.

Accordingly, the most important factor in abrasive that affects wafer quality is abrasive grains. Abrasive grains are largely divided into abrasive grains which disperse in water as primary grains, and abrasive grains which disperse as secondary grains consisting of a plurality of aggregated primary grains. Which of the primary and secondary grains to use, or what ratio to mix them depends on objects to be ground or machining purposes.

On the other hand, for the purpose of enhancement in grinding characteristics, various suggestions which focus on abrasive grain shapes have been made by each material maker.

Japanese patent application laid-open No. 7-221059 describes that, in grinding a semiconductor wafer, grinding speed is faster by grinding a colloidal silica shape observed by an electron microscope with non-spherical abrasive grains defined by minor to major axes ratios. As a result of examination on this by the present inventor, the grinding speed of amorphous abrasive grains typically tends to be faster than that of spherical abrasive grains. Even though abrasive grains are amorphous, however, its grinding speed is not necessarily faster. Also, when abrasive grains are observed with an electron microscope, unlike a dispersed state in an actual solution, tertiary grains consisting of a plurality of aggregated secondary grains or quaternary grains consisting of a plurality of aggregated tertiary grains are observed, which causes many errors, and are not efficient.

Japanese patent application laid-open No. 2001-11433 describes that the grinding speed of abrasive grains consisting of spherical colloidal silica grains linked within one plane by adding a divalent or trivalent metal oxide to the spherical colloidal silica grains is faster, and that a flat smooth surface is obtained with high precision. In this case, however, added metal ions are an impurity which adversely affects a wafer surface.

Japanese patent application laid-open No. 9-296161 discloses an abrasive using abrasive grains for reducing defects (e.g., flaws), in which water is caused to intervene between primary grains to form elastic secondary grains by heating a high-purity fumed silica solution. However, control of grain size and secondary grain shape is difficult, and stable grinding characteristics cannot be obtained, which results in no effect on some objects to be ground.

Japanese patent application laid-open No. 2002-338232 discloses an abrasive composition using aggregated spherical colloidal silica grains with its uneven surface as abrasive grains, aggregated by a flocculant and aggregation aid. It describes use of polyaluminum chloride as the flocculent, however, such added metals are a kind of impurities, which results in a contaminated wafer surface to be ground.

Compound semiconductor wafers and semiconductor wafers are fabricated by means of primary grinding (rough grinding) and secondary grinding (mirror finish). Typically, the primary grinding is performed by pressing a wafer on a soft abrasive pad of a nonwoven cloth or a suede type, and exerting a constant pressure, dripping an abrasive consisting of abrasive grains, oxidizer, alkali reagent, etc. Large problems with the primary grinding step lie in ensuring a wafer shape is of a stable precision, and realizing high-speed grinding. In particular, wafer shape is important, where failure to ensure a wafer shape with a stable precision would affect the subsequent secondary grinding step. The secondary grinding step is the mirror finish step by smoothing wafer surface roughness, often using an abrasive without abrasive grains, which results in no shape correction capability. In other words, it is necessary to constantly ensure a wafer shape with a stable precision in the primary grinding step. In particular, a soft abrasive pad of a nonwoven cloth or a suede type typically tends to cause peripheral dripping in the wafer, compared to a abrasive pad made of foamed polyurethane used in CMP (Chemical Mechanical Polishing), which results in difficulty in obtaining good flatness.

Also, there is the large problem that the above soft abrasive pad degrades fast, grinding characteristics changing with the degradation of the abrasive pad, which results in more remarkable peripheral dripping in a wafer peripheral portion. As a method for improving malfunction caused by the abrasive pad, there is the method for improving flatness by increasing the elasticity of the abrasive pad, but using this would rather increase the incidence of flaws.

On the other hand, in the research and development of abrasives, as described in the above patent references, various researches have been made on grinding speed, surface roughness, and the reduction of defects (e.g., flaws), but as it stands, there are no disclosures about techniques for enhancing flatness by preventing peripheral dripping, or enhancing wafer shape stability over time.

SUMMARY OF THE INVENTION

It is an object of the invention to provide abrasive grains that can ensure enhancement in grinding speed, flatness, and wafer shape stability over time, and can ensure stable grinding characteristics.

It is a further object of the invention to provide an abrasive containing the abrasive grains, an abrasive solution containing the abrasive grains, a method for preparing the abrasive solution, a grinding method by the abrasive solution, and a semiconductor device fabrication method using the abrasive solution.

(1) According to one aspect of the invention, Abrasive grains comprises mainly grains with a roundness of 0.50 or more and 0.75 or less, where the roundness is defined as the ratio of the circumference of a circle having the same area as that of a grain to the perimeter of that grain.

It is preferred that the roundness is 0.55 or more and 0.72 or less.

In detail, the roundness is a roundness when a medium containing the grains is agitated to disperse them while being irradiated with ultrasound.

It is preferred that the grains comprise a plurality of aggregated primary grains with an average grain size of 0.005 μm or more and 0.1 μm or less.

It is preferred that the average grain size of the aggregated primary grains is 1 μm or more and 30 μm or less.

It is further preferred that the average grain size of the aggregated primary grains is 3 μm or more and 20 μm or less.

In detail, the average grain size of the aggregated primary grains is an average grain size when a medium containing the grains is agitated to disperse them while being irradiated with ultrasound.

(2) According to another aspect of the invention, an abrasive comprises:

abrasive grains that comprise mainly grains with a roundness of 0.50 or more and 0.75 or less, where the roundness is defined as the ratio of the circumference of a circle having the same area as that of a grain to the perimeter of that grain; and at least one of an oxidizer, an oxide solution, an abrasive grain dispersion agent and a basic compound.

It is preferred that the oxidizer is sodium dichloroisocyanurate, the oxide solution is sodium tripolyphosphate; the abrasive grain dispersion agent is sodium sulfate; and the basic compound is sodium carbonate or sodium hydroxide.

(3) According to another aspect of the invention, an abrasive solution comprises:

abrasive grains that comprise mainly grains with a roundness of 0.50 or more and 0.75 or less, where the roundness is defined as the ratio of the circumference of a circle having the same area as that of a grain to the perimeter of that grain; and water or hydrophilic substance.

It is preferred that the abrasive grain content is 10 wt % or more and 40 wt % or less when the total amount of the solid content in the abrasive solution is 100 wt %.

It is preferred that the abrasive grain content is 0.5 wt % or more and 5 wt % or less when the total amount of the abrasive solution is 100 wt %.

It is preferred that the abrasive solution further comprises at least one of an oxidizer, an oxide solution, an abrasive grain dispersion agent and a basic compound.

It is preferred that the oxidizer is sodium dichloroisocyanurate, the oxide solution is sodium tripolyphosphate, the abrasive grain dispersion agent is sodium sulfate, and the basic compound is sodium carbonate or sodium hydroxide.

It is preferred that the abrasive solution is used for grinding group III-V compound semiconductor material or semiconductor material.

(4) According to another aspect of the invention, a method for preparing an abrasive solution comprises the steps of:

adding an abrasive to a medium, wherein the abrasive comprises: abrasive grains that comprise mainly grains with a roundness of 0.50 or more and 0.75 or less, where the roundness is defined as the ratio of the circumference of a circle having the same area as that of a grain to the perimeter of that grain; and at least one of an oxidizer, an oxide solution, an abrasive grain dispersion agent and a basic compound; and and agitating the medium while irradiating it with ultrasound.

(5) According to another aspect of the invention, a grinding method comprises the step of:

grinding an object to be ground at a grinding pressure of 2-10 kPa, using an abrasive solution, wherein the abrasive solution comprises: abrasive grains that comprise mainly grains with a roundness of 0.50 or more and 0.75 or less, where the roundness is defined as the ratio of the circumference of a circle having the same area as that of a grain to the perimeter of that grain; and water or hydrophilic substance.

(6) According to another aspect of the invention, a method for fabricating a semiconductor device comprises the steps of:

grinding a surface of a substrate comprising a compound semiconductor wafer or a semiconductor wafer by using an abrasive solution that comprises: abrasive grains that comprise mainly grains with a roundness of 0.50 or more and 0.75 or less, where the roundness is defined as the ratio of the circumference of a circle having the same area as that of a grain to the perimeter of that grain; and water or hydrophilic substance;

etching a ground damage layer of the surface of the substrate;

forming semiconductor layers sequentially and forming ohmic contact;

diffusing impurities and implanting ions;

forming a substrate protection film; and cutting the substrate.

<Advantages of the Invention>

The invention can provide an excellent-shape wafer without peripheral dripping, while realizing high-speed grinding. Also, the invention is suitable for grinding wafers having a poor mechanical strength and a strong cleavage.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
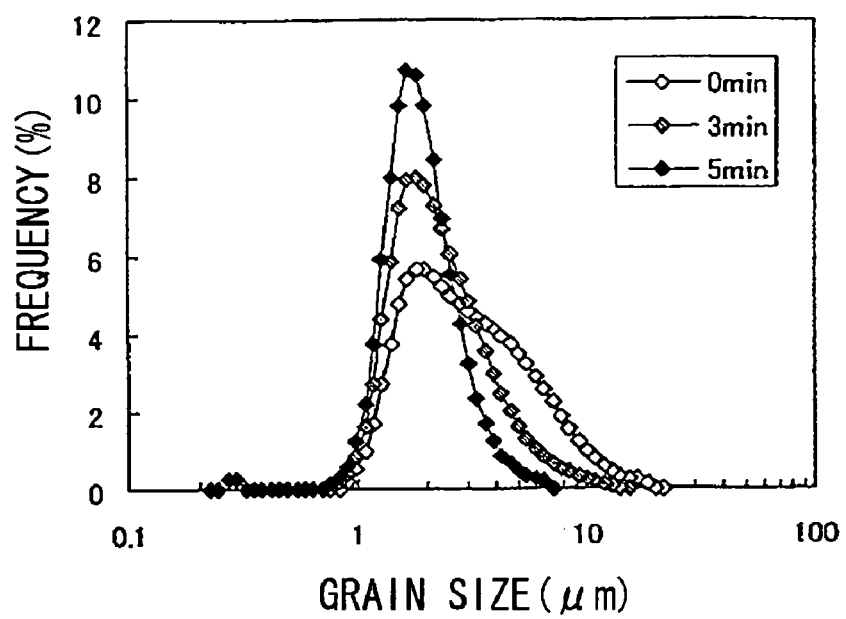
FIG. 1 is a graph showing change over time of grain-size distribution against homogenizer dispersion time of No. 1 in Example 1.
Figure 2:
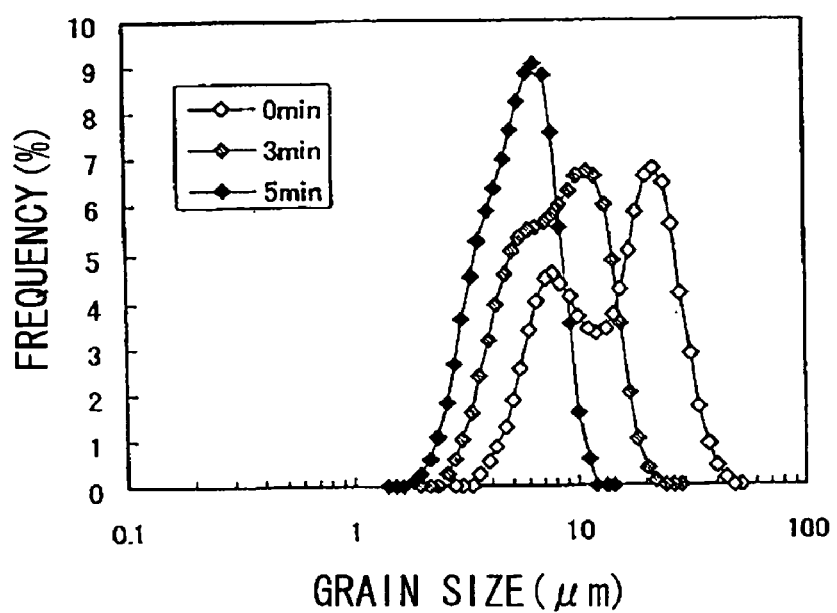
FIG. 2 is a graph showing change over time of grain-size distribution against homogenizer dispersion time of No. 2 in Example 1.
Figure 3:
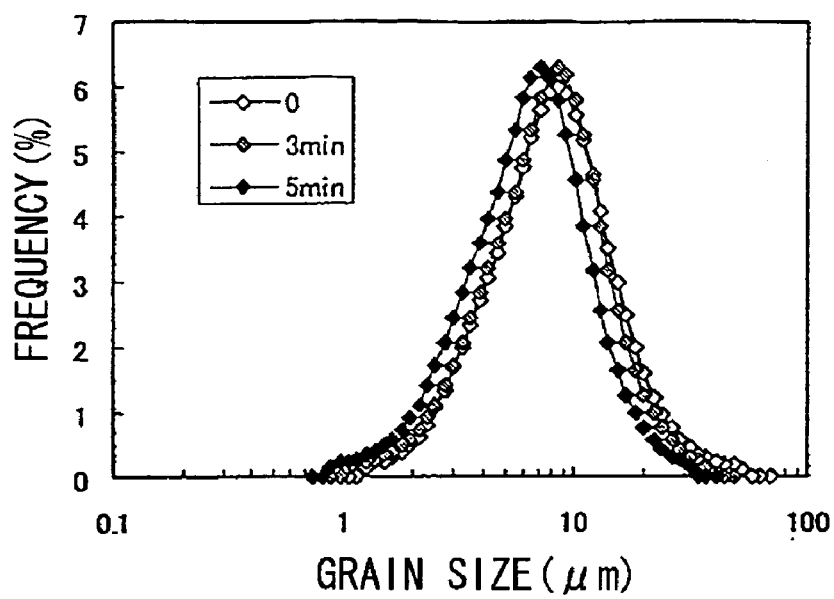
FIG. 3 is a graph showing change over time of grain-size distribution against homogenizer dispersion time of No. 3 in Example 1.
Figure 4:
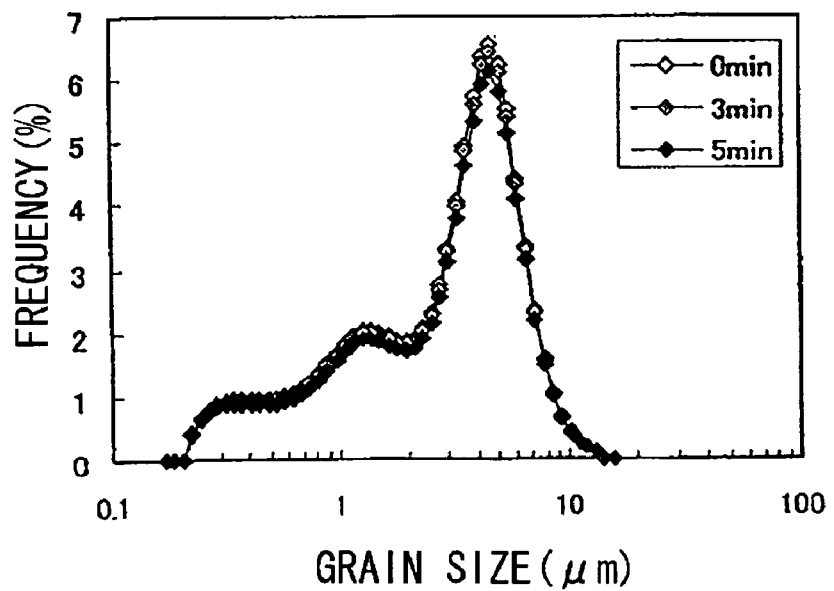
FIG. 4 is a graph showing change over time of grain-size distribution against homogenizer dispersion time of No. 4 in Example 1.
Figure 5:
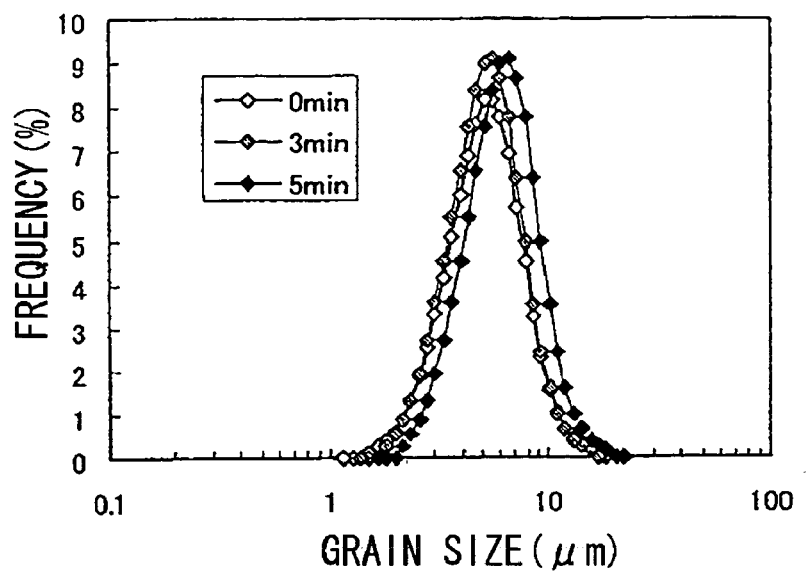
FIG. 5 is a graph showing change over time of grain-size distribution against homogenizer dispersion time of No. 5 in Example 1.
Figure 6:
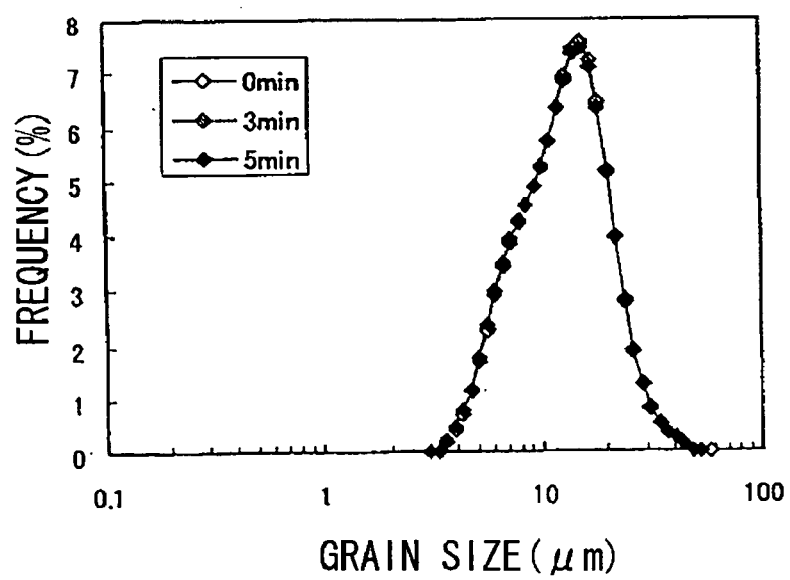
FIG. 6 is a graph showing change over time of grain-size distribution against homogenizer dispersion time of No. 6 in Example 1.
Figure 7:
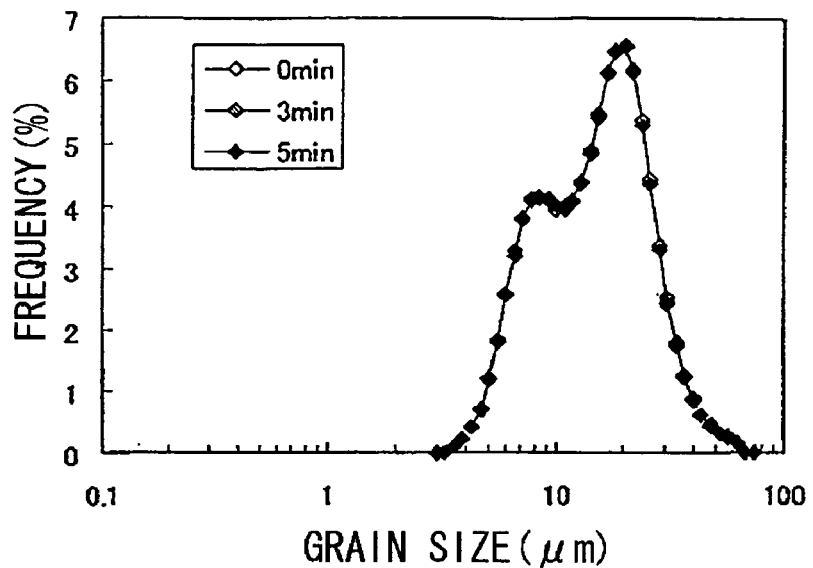
FIG. 7 is a graph showing change over time of grain-size distribution against homogenizer dispersion time of No. 7 in Example 1.
Figure 8:
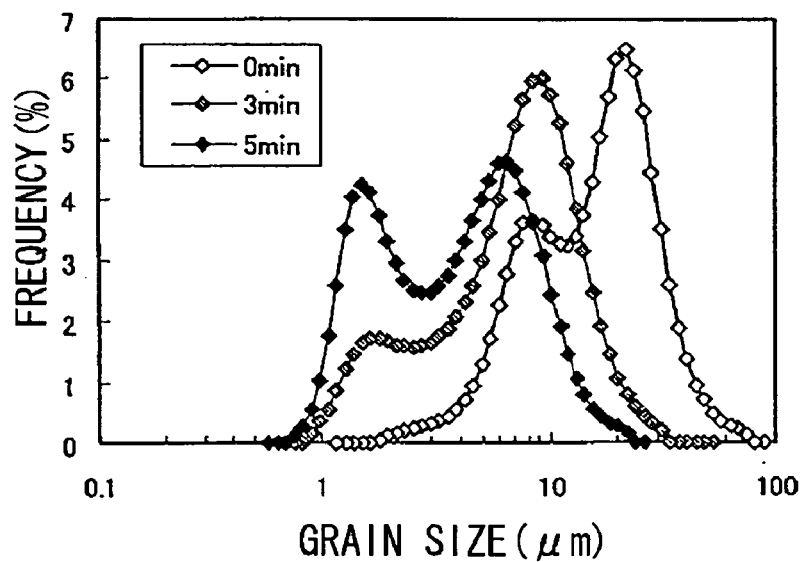
FIG. 8 is a graph showing change over time of grain-size distribution against homogenizer dispersion time of No. 8 in Comparative Example 1.
Figure 9:
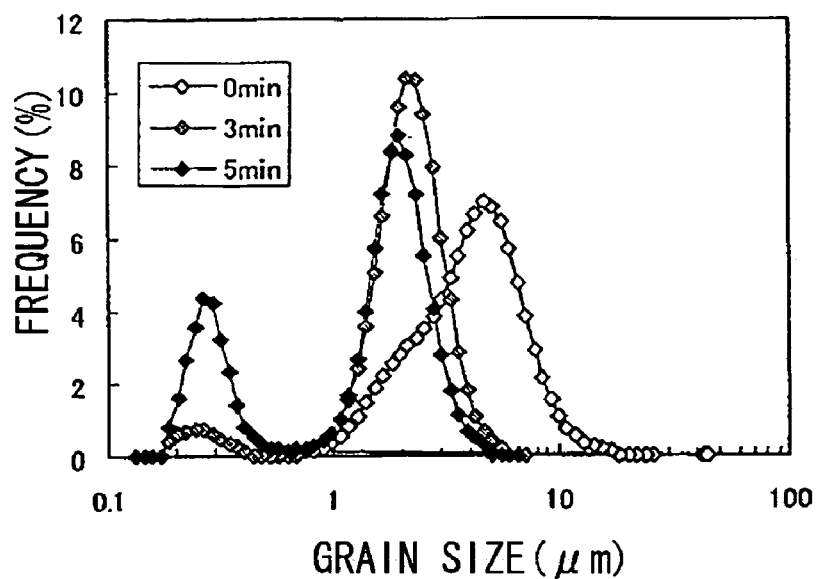
FIG. 9 is a graph showing change over time of grain-size distribution against homogenizer dispersion time of No. 9 in Comparative Example 1.
Figure 10:
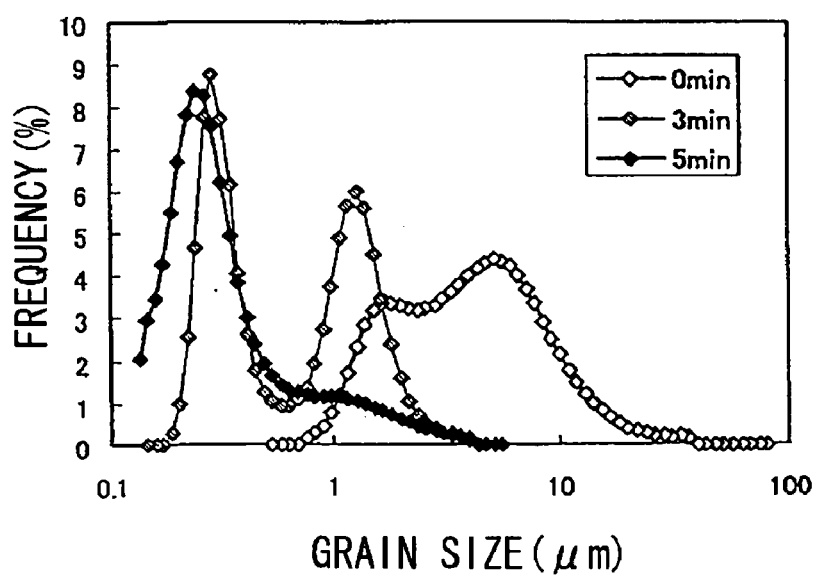
FIG. 10 is a graph showing change over time of grain-size distribution against homogenizer dispersion time of No. 10 in Comparative Example 1.
Figure 11:
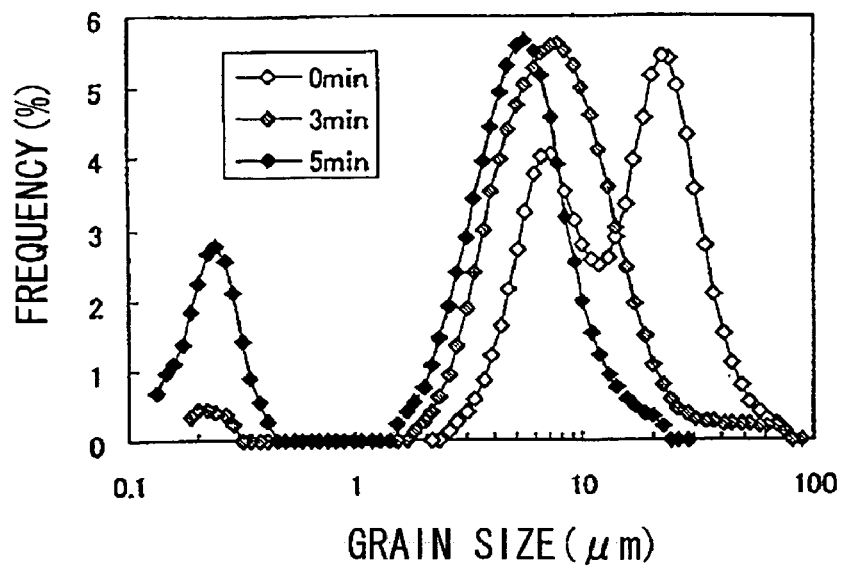
FIG. 11 is a graph showing change over time of grain-size distribution against homogenizer dispersion time of No. 11 in Comparative Example 1.
Figure 12:
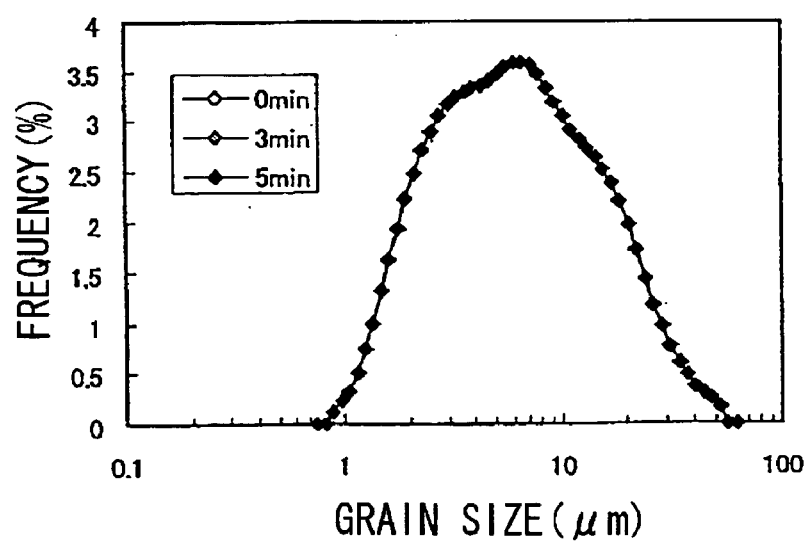
FIG. 12 is a graph showing change over time of grain-size distribution against homogenizer dispersion time of No. 12 in Comparative Example 1.

The invention is a technique for controlling a wafer shape and grinding speed with abrasive grain characteristics (roundness, cohesion, average grain size, grain-size distribution). The invention is explained in further detail below.

<Grinding Characteristics of Abrasive Grains>

Grinding characteristics of grains dispersing as primary grains depend on average grain size only. However, the state of ground aggregated grains is varied according to dispersion conditions, and during grinding, aggregated grains are ground by grinding pressure, so that their grain size and grain shape are also varied. For this reason, grinding characteristics of the aggregated grains cannot be determined from shape observation by an electron microscope before dispersion, and are also difficult to be determined from shape observation after dispersion using both ultrasonic irradiation and agitation because it may be an apparent shape. It is not clear in which process the characteristics of the aggregated grains affect grinding characteristics, but the characteristics of the aggregated grains immediately before or during grinding affect grinding characteristics. Accordingly, in order to best bring aggregated grains into such a state, they were dispersed using both ultrasonic irradiation and agitation, and a homogenizer was applied to form an artificial state of aggregated grains immediately before or during grinding. As a result of then examining the relationships between the characteristics of the aggregated grains (roundness, cohesion, average grain size, grain-size distribution) and grinding characteristics [grinding speed and wafer shape (TTV: Total Thickness Variation)], the present inventors found out strong correlations between the roundness of aggregated grains and grinding speed and wafer shape.

<Roundness>

Roundness is a value that shows the difference of shape relative to a sphere, and is generally assessed using the following formulae 1 and 2. Formula 1 is the ratio of the circumference of a circle having the same area as that of a grain projection image, to the perimeter of the grain projection image, and Formula 2 is the ratio of the area of a grain projection image to the area of a circle whose diameter is the longest diameter of the grain projection image. Both are the quantification of a two-dimensional image, and approach one as it approaches a perfect circle, while they become less than one as it is more different from a perfect circle.

Formula 1:

Roundness=(the circumference of a circle having the same area as that of the projected grain)/(the perimeter of the projected grain)

Formula 2:

Roundness=(the area of the projected grain)/((diameter of a circle which is the longest diameter of the projected grain)/2)$^2\pi$ The shape of abrasive grains when they affect the wafer surface and side surfaces during grinding is important. Accordingly, roundness is preferred when abrasive grains are assumed to be as close as possible to a state during grinding. However, roundness before dispersion into a medium, roundness during dispersion by ultrasonic irradiation and agitation in the medium, and roundness during dispersion or grinding by a homogenizer for a constant time may be entirely different dependent on kinds of abrasive grains (in particular, in the case of aggregated grains with weak cohesion). Accordingly, roundness is preferred in the medium when abrasive grains are first dispersed by ultrasonic irradiation and agitation, and then dispersed or ground by a homogenizer for a constant time.

Roundness in the invention is based on Formula 1 which is remarkable in significant difference compared to roundness calculated by Formula 2. Specifically, it uses results measured by commercial grain image analyzers equipped with both a grain image photography mechanism and an image analysis device by microscope observation in the medium, and is calculated by Formula 3. Also, roundness in the invention is preferably average roundness of one body when a plurality of aggregated primary grains are measured as one body. Further, average grain size of abrasive grains in the invention is preferred when they are dispersed using both ultrasonic irradiation and agitation.

Formula 3:

Roundness=(the circumference of a circle having the same area as that of the projected grain)/(the perimeter of the projected grain)

<Aggregated Grains>

Aggregated grains according to the invention may be any silica of commercial colloidal silica, fumed silica, precipitated silica, and gel-type silica, regardless of kinds of silica. Also, two or more of the above silica may be mixed or aggregated. Any preparation method for aggregated grains may be used: grains may be aggregated by causing water to intervene therebetween, or by adsorbing, to the surface of primary grains, aliphatic esters, methyl or ethyl esters such as octanoic acid, lauric acid, myristic acid, palmitic acid, stearic acid, etc., which serve as lubrication.

<Average Grain Size of Abrasive Grains>

When the average grain size of abrasive grains is selected, the surface shape of an abrasive pad has to be taken into consideration. Dependent on kinds of abrasive pads used, the space between fibers of a nonwoven cloth is larger than that of abrasive pads made of foamed polyurethane for general CMP (Chemical Mechanical Polishing), and the average grain size needs to be 1 μm or more, preferably 3 μm or more. In case the average grain size is less than 3 μm, the grain size is smaller than the space between fibers of the abrasive pad surface, which results in no abrasive grains being held on the abrasive pad and no abrasive grain effects being exhibited. As a consequence, exhibited are only chemical effects, which results in a reduction of grinding speed, peripheral dripping, and a deterioration of wafer shape. On the other hand, in case the average grain size is 30 μm or more, abrasive grains with strong cohesion cannot be used because of the high incidence of flaws, chips, etc. Thus, the average grain size is 30 μm or less, preferably 20 μm or less.

<Medium>

As the medium, pure water is typically used, but the invention is not limited thereto. Also, the abrasive grain content of an abrasive solution of the invention is preferably 10 wt % or more and 40 wt % or less when the total amount of the solid content is 100 wt %. In the case of less than 10 wt %, sufficient grinding speed may be not obtained. In the case of exceeding 40 wt %, a mechanical factor is too strong, which may cause grinding flaws, etc., and result in no remarkable enhancement in grinding speed being expected.

The abrasive grain content of an abrasive solution of the invention is preferably 0.5 wt % or more and 5 wt % or less, more preferably 0.7 or more and 2 wt % or less when the total amount of the abrasive solution containing the medium is 100 wt %. In the case of less than 0.5 wt %, no abrasive grain effects are exhibited, which results in a reduction of grinding speed and a deterioration of wafer shape. In the case of exceeding 5 wt %, the surface is rough, which results in flaws, haze, etc.

The abrasive concentration of the medium is preferably 0.5 or more and 50 wt % or less, more preferably 1 or more and 20 wt % or less. In the case of less than 1 wt %, no abrasive grain effects are exhibited, which results in a reduction of grinding speed and a deterioration of wafer shape. In the case of exceeding 20 wt %, the surface is rough, which results in flaws, haze, etc.

<Dispersion Time>

The dispersion time (ultrasonic irradiation and agitation time) is preferably 5 min or more and 15 min or less. In the case of the dispersion time (ultrasonic irradiation and agitation time) exceeding 15 min, the temperature of the abrasive solution rises up, which may increase the decomposition speed of an oxidizer, and result in a problem in grinding characteristics. In the case of less than 5 min, the dispersiveness of abrasive grains may be not sufficient.

<Grinding Method>

Also, the invention provides a method for grinding the surface of an object to be ground using the above abrasive solution. In this grinding method of the invention, for aggregated grains to be easily dissociated, the grinding pressure (pressure applied between the abrasive pad and the object to be ground during grinding) is preferably 2-10 kPa, more preferably 3-7 kPa. Lower grinding pressures than 2 kPa may result in insufficient dissociation of aggregated grains, and a reduction of grinding capability due to too low grinding pressure applied to the wafer. On the other hand, in the case of a compound semiconductor wafer with strong cleavage to be ground, higher grinding pressures than 10 kPa results in the wafer tending to crack due to too high grinding pressure.

The grinding method of the invention can be applied to semiconductor wafers such as compound semiconductor wafers, silicon wafers, etc., and the object to be ground is not limited to a particular semiconductor wafer, but is suitable particularly for grinding wafers comprising group III-V compound semiconductors such as GaAs, GaP, GaSb, AlAs, InAs, GaAlAs, GaAsP, etc.

<Semiconductor Device Fabrication Method>

The invention provides a semiconductor device fabrication method comprising the step of grinding a semiconductor wafer surface or group III-V compound semiconductor wafer surface, using the above grinding method of the invention.

The steps other than the grinding step of the semiconductor device fabrication method of the invention are not limited. The semiconductor device fabrication method of the invention may comprise the steps of: (1) grinding the surface of a substrate by an abrasive solution of the invention; (2) etching a grinding damage layer of the substrate surface; sequentially forming semiconductor layers and forming ohmic contact; (4) dispersing impurities and implanting ions; (5) forming a surface protection film; and (6) cutting the substrate.

EXAMPLE 1

This Example examined grinding characteristics of an abrasive dissolved and dispersed in pure water, as shown in Table 1, using silica Nos. 1-7 as abrasive grains.

TABLE 1

| Abrasive content | Composition [wt %] | Concentration |
|---|---|---|
| Silica (abrasive grains) | 20 | 11 [g/l] |
| Sodium dichloroisocyanurate | 35 | 0.0082 [mol/l] |
| Sodium tripolyphosphate | 22 | 0.03 [mol/l] |
| Sodium sulfate | 18 | 0.06 [mol/l] |
| Sodium carbonate | 5 | 0.025 [mol/l] |

First, silica Nos. 1 and 2 use fumed silica with an average grain size of 50 nm measured by the BET method, and aggregated silica grains are formed in the conditions of Table 2. In forming each aggregated silica, fumed silica as an ingredient and a predetermined amount of pure water are mixed uniformly by a Heichel mixer. Subsequently, aggregated silica No. 1 is hot-air dried for 24 hr at 120° C. in a constant-temperature bath, while aggregated silica No. 2 is heat-dried for 2 hr being uniformly mixed at 100° C. by a Heichel mixer. Nos. 1 and 2 are then ground at 25° C. by a pin mill. Aggregated silica Nos. 3-7 are commercial synthetics prepared by the wet method.

difference and grinding time. Wafer shape (TTV: Total Thickness Variation) is the measured difference between the highest and lowest points of wafer thickness, taking the back side of the wafer as the reference point of the wafer shape (TTV), and TTV shows thickness variation, i.e., flatness of the wafer surface. Also, surface roughness (Pv) is the measured difference between the highest and lowest points

TABLE 2

| Conditions | No. 1 | No. 2 | No. 3 | No. 4 | No. 5 | No. 6 | No. 7 |
|---|---|---|---|---|---|---|---|
| Pure water added [%] | 47.7 | 55 | Commercial silica | Commercial silica | Commercial silica | Commercial silica | Commercial silica |
| Dry | Const. temp. bath: 120° C. × 24 hr | Heichel mixer: 100° C. × 24 hr | | | | | |
| Dispersion & grinding | none | Pin mill: 25° C. | | | | | |
| Volatile cont. [wt %] | 0 | 0 | 10 | 9.5 | 6.7 | 7 | 7 |

Figure 13:
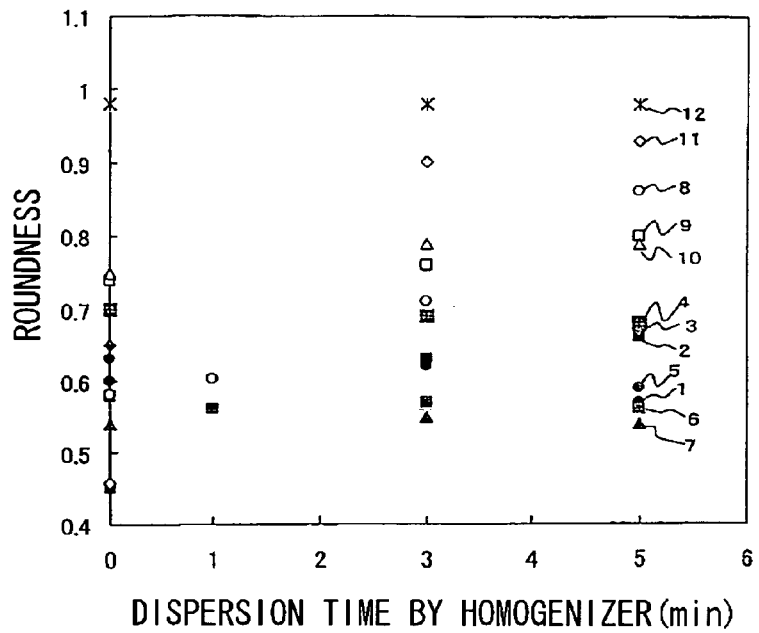
FIG. 13 is a graph showing change of roundness against dispersion time by the homogenizer, concerning abrasive grains Nos. 1-7 of Example 1 and abrasive grains Nos. 8-12 of Comparative Example 1.

This Example prepares abrasives having composition shown in Table 1 using seven abrasive grains shown in Table 2, and then dilutes these abrasives about 20 times with pure water, and irradiates them with frequency 40 W ultrasound to prepare abrasive solutions. These abrasive solutions are taken as a reference point (0 min), and are dispersed and ground by applying a homogenizer 200 μA power (Nihon Seiki Co. Ltd.) continuously for 1, 3 and 5 minutes. Respective changes over time of their average grain size, grain-size distribution and roundness are observed. Average grain size and grain-size distribution are measured by a commercial laser-type grain-size analyzer, and roundness are measured by a commercial grain image analyzer, diluting the abrasive solutions 15 times after 0, 3 and 5 minutes. Average grain size and roundness of abrasive solutions Nos. 1-7 are shown in Table 3. Also, each change over time of grain-size distribution is shown in FIGS. 1-7, and each change over time of roundness is shown in FIG. 13. Further, this change of grain-size distribution is considered to provide an indication of cohesion. It is determined that, with grain-size distribution curves changing over time, the cohesion of abrasive grains changing to the small grain-size side tended to be weaker, while the cohesion of abrasive grains whose grain-size distribution curve change was not remarkable tends to be stronger.

TABLE 3

| Silica (abrasive grains) | Average grain size [μm] | | Roundness | |
|---|---|---|---|---|
| | 0[min](*1) | 5[min](*1) | 0[min](*1) | 5[min](*1) |
| No. 1 | 3.74 | 1.46 | 0.59 | 0.56 |
| No. 2 | 14.44 | 5.24 | 0.45 | 0.66 |
| No. 3 | 7.72 | 6.20 | 0.65 | 0.67 |
| No. 4 | 3.26 | 3.03 | 0.70 | 0.68 |
| No. 5 | 4.88 | 4.9 | 0.60 | 0.59 |
| No. 6 | 12.42 | 12.32 | 0.58 | 0.56 |
| No. 7 | 14.82 | 14.70 | 0.54 | 0.54 |

(*1)Dispersion time by the homogenizer

Next, using the abrasive solutions obtained, an about 100 mm (4 inches)-size GaAs wafer is ground in the conditions shown in Table 4. The results are shown in Table 5. Further, grinding speed is measured in a central portion of wafer thickness before and after grinding by a contact laser displacement gauge, and is calculated from wafer thickness difference and grinding time. Wafer shape (TTV: Total Thickness Variation) is the measured difference between the highest and lowest points of wafer thickness, taking the back side of the wafer as the reference point of the wafer shape (TTV), and TTV shows thickness variation, i.e., flatness of the wafer surface. Also, surface roughness (Pv) is the measured difference between the highest and lowest points of the uneven surface. Also, appearance is denoted by "very good" (very few grinding flaws and marks seen), "good" (few grinding flaws and marks seen), and "poor" (many grinding flaws and marks seen).

TABLE 4

| Items | Conditions |
|---|---|
| Sample | 100 mm-size GaAs wafer |
| Grinding pressure | 3.5 kPa [35 gf/cm$^2$] |
| No. of revolutions of the plate | 74 [rpm] |
| Abrasive supply | 15 [ml/min] |
| Grinding time | 60 [min] |

TABLE 5

| Silica (abrasive grains) | Grinding speed [μm/min] | Wafer shape (TTV) [μm] | Surface roughness (Pv)[nm] | Appearance |
|---|---|---|---|---|
| No. 1 | 0.6 or more | 1.5 | 3-5 | Very good |
| No. 2 | 0.6 or more | 1.3 | 3-5 | Very good |
| No. 3 | 0.6 or more | 1.4 | 3-5 | Very good |
| No. 4 | 0.6 or more | 1.4 | 3-5 | Very good |
| No. 5 | 0.53 | 1.6 | 3-5 | Very good |
| No. 6 | 0.52 | 1.8 | 4-7 | Very good |
| No. 7 | 0.55 | 2.0 | 5-10 | Good |

COMPARATIVE EXAMPLE 1

This Comparative Example uses silica Nos. 8-12 as abrasive grains to examine grinding characteristics of an abrasive diluted with pure water to be dispersed therein and ground, in the same manner as Example 1. Silica Nos. 8-12 uses the same fumed silica as that of Example 1, and aggregated silica grains are formed in the conditions of Table 6. Each aggregated silica is mixed in the same manner as that of Example 1. Subsequently, aggregated silica Nos. 8-12 are heat-dried at 100° C. for 2 hr being rolled by a Heichel mixer, while aggregated silica No. 11 is heat-dried and then ground by further increasing the shear force of the Heichel mixer. Further, to weaken the cohesion between aggregated grains, heating aggregated silica No. 10 is stopped when the moisture content reaches 30 wt %. Also, aggregated silica No. 12 is commercial synthetic spherical silica by the spray method, which is dispersed in the abrasive solution as primary grains.

TABLE 6

| Conditions | No. 8 | No. 9 | No. 10 | No. 11 | No. 12 |
|---|---|---|---|---|---|
| Pure water added [%] | 49 | 46.5 | 46.5 | 55 | Commercial silica |
| Dry | Heichel mixer: 100° C. × 2 hr | Heichel mixer: 100° C. × 2 hr | Heichel mixer: 100° C. × 2 hr | Heichel mixer: 100° C. × 2 hr | |
| Dispersion & grinding | none | none | none | Heichel mixer: 25° C. | |
| Volatile cont. [wt %] | 0 | 0 | 30 | 0 | 0 |

This Comparative Example prepares five abrasives using silica Nos. 8-12 shown in Table 6 as abrasive grains, and then prepares abrasive solutions, in the same manner as Example 1. These abrasive solutions are taken as a reference point (0 min), and respective changes over time of their average grain size, grain-size distribution and roundness are observed in the same manner as Example 1. Average grain size and roundness of abrasive solutions of silica Nos. 8-12 are shown in Table 7. Also, each change over time of grain-size distribution is shown in FIGS. 8-12, and each change over time of roundness is shown in FIG. 13. Also, using the abrasive solutions obtained, the results of grinding in the same manner as Example 1 are shown in Table 8.

TABLE 7

| Silica (abrasive grains) | Average grain size[μm] | | Roundness | |
|---|---|---|---|---|
| | 0[min](*1) | 5[min](*1) | 0[min](*1) | 5[min](*1) |
| No. 8 | 12.3 | 3.81 | 0.58 | 0.86 |
| No. 9 | 4.7 | 1.6 | 0.74 | 0.80 |
| No. 10 | 4.14 | 0.27 | 0.75 | 0.79 |
| No. 11 | 14.61 | 4.23 | 0.46 | 0.93 |
| No. 12 | 5.79 | 5.79 | 0.98 | 0.98 |

TABLE 8

| Silica (abrasive grains) | Grinding speed [μm/min] | Wafer shape (TTV) [μm] | Surface roughness (Pv)[nm] | Appearance |
|---|---|---|---|---|
| No. 8 | 0.56 | 1.0 (peripheral dripping) | 3-5 | Very good |
| No. 9 | 0.60 | 0.8 (peripheral dripping) | 3-5 | Very good |
| No. 10 | 0.53 | 1.1 (peripheral dripping) | 3-5 | Very good |
| No. 11 | 0.51 | 0.5 (peripheral dripping) | 3-5 | Very good |
| No. 12 | 0.43 | 1.2 (peripheral dripping) | 6-12 | Poor |

The results of abrasive grain assessment and grinding experiments of Example 1 and Comparative Example 1 are explained below. From FIG. 13 showing change of roundness against dispersion time (dispersion and grinding time), the roundness of abrasive grains Nos. 1-7 of Example 1 when dispersed and ground by applying the homogenizer for 5 min is all less than 0.75, and as a result of grinding by the abrasive solutions using abrasive grains Nos. 1-7, the wafer shape is good as shown in Table 5.

On the other hand, the roundness of abrasive grains Nos. 8-12 of Comparative Example 1 when dispersed and ground by applying the homogenizer for 5 min is all more than 0.75, and as a result of grinding by the abrasive solutions using abrasive grains Nos. 8-12, peripheral dripping occurred on a wall of a wafer peripheral portion as shown in Table 8.

It is found from this result that, in the case of a roundness of 0.75 or less, preferably less than 0.72 or less, good-flatness wafer shape can be ensured without peripheral dripping. In other words, by using abrasive grains with a roundness of 0.55 or more and 0.72 or less, deterioration of wafer shape due to change over time of the abrasive pad can be controlled. In comparison, from the result of Comparative Example 1 showing a roundness of 0.75 or more, as abrasive grain roundness increases and abrasive grain shape approaches a sphere, wafer shape tends to be poorer and peripheral dripping is more remarkable. Abrasive grains No. 12 are silica extremely close to a sphere, which are dispersed into the medium as primary grains, and grinding by use of abrasive grains No. 12 causes flaws and chips in the wafer surface and periphery, which results in a remarkable deterioration of wafer shape and a remarkable reduction of grinding speed.

Figure 14:
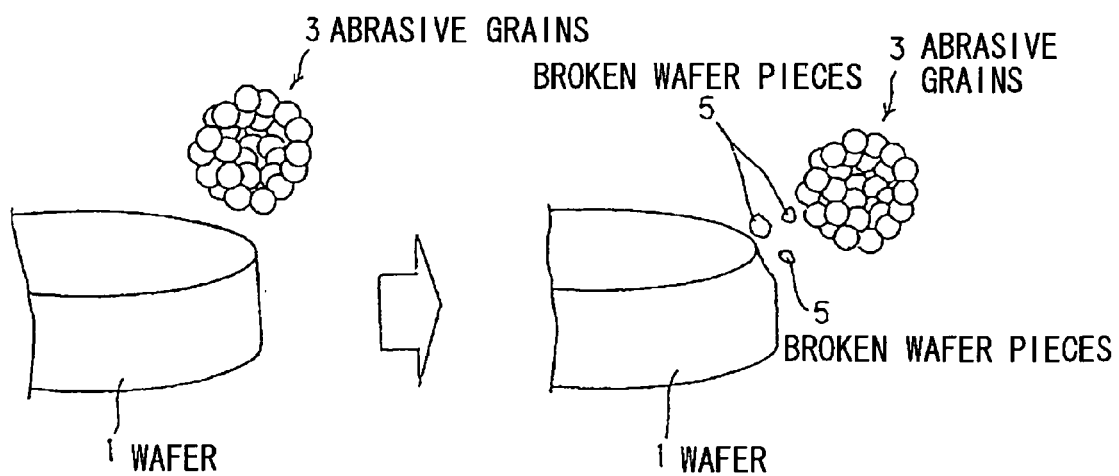
FIG. 14 is a diagram illustrating collision of abrasive grains with a wafer side surface during grinding using abrasive grains of Comparative Example 1.
Figure 15:
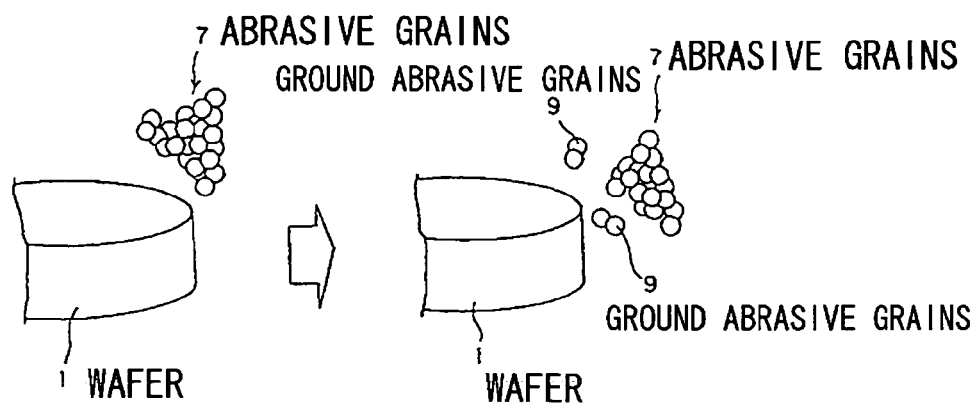
FIG. 15 is a diagram illustrating collision of abrasive grains with a wafer side surface during grinding using abrasive grains of Example 1.

Effects of grinding characteristics on abrasive grain shape are explained below. First, the relationship between abrasive grain shape and wafer shape is explained. In the case of a roundness of 0.75 or more, when abrasive grains 3 of silica close to a sphere collide with a side surface of a wafer 1 during grinding, since silica is harder than GaAs, the side surface of the wafer 1 is ground to cause broken wafer pieces 5, as shown in FIG. 14. Also, since silica close to a sphere has no holding force and tends to roll on an abrasive pad, silica is pushed to a peripheral portion of the abrasive pad by rotation of the plate. For this reason, the periphery of the wafer 1 is ground to cause peripheral dripping. As aggregated grain cohesion is stronger, this phenomenon is more remarkable and more flaws, chips, etc. occur. This is easily understood by analogy with the result of grinding silica No. 12. On the other hand, more amorphous silica with a lower roundness being more different from a perfect circle is ground with the periphery of the wafer caused to rise. This makes a corner of abrasive grains 7 fragile by an impact, as shown in FIG. 15. For this reason, when abrasive grains 7 collide with a side surface of the wafer 1, a corner of abrasive grains 7 is ground to cause ground abrasive grains 9, but the side surface of the wafer 1 is thereby not ground.

Also, since amorphous abrasive grains 7, unlike spherical abrasive grains 3, are held on the abrasive pad without rolling and being pushed to a peripheral portion of the wafer. For this reason, as the roundness of abrasive grains becomes lower and more amorphous, less peripheral dripping of the wafer occurs.

Figure 16:
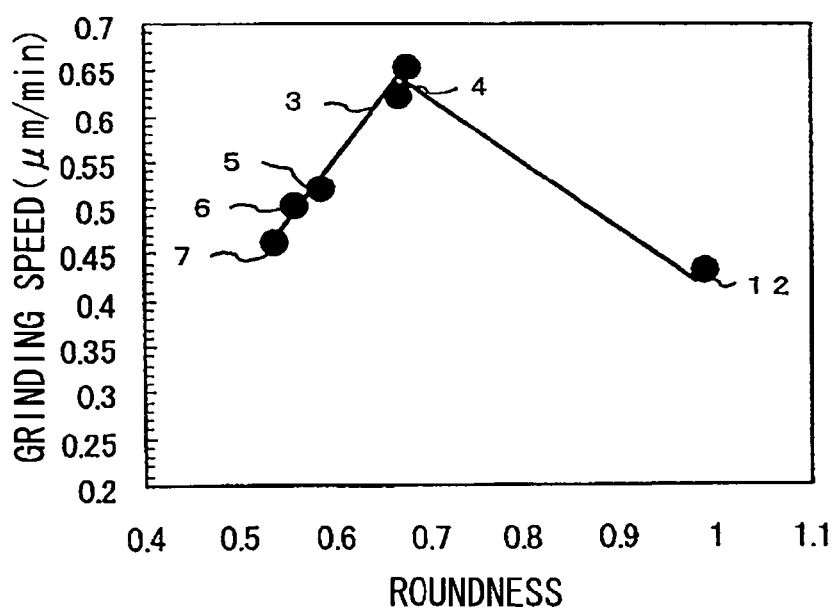
FIG. 16 is a graph showing the relationship between grinding speed and roundness of commercial abrasive grains Nos. 3-7 of Example 1 and of abrasive grains No. 12 of Comparative Example 1.

Second, the relationship between abrasive grain shape and grinding speed is explained. Grinding speed is largely affected by abrasive grain shape as well as being affected by a contact area between abrasive grains and the wafer, and by holding force on the abrasive pad of abrasive grains. FIG. 16 shows the relationship between roundness and grinding speed. The graph of FIG. 16 has a maximum extreme. As the roundness exceeding 0.7 approaches a perfect circle (roundness goes up), the grinding speed decreases. Also, at 0.7 or less, as the roundness is more different from a perfect circle and more amorphous, the grinding speed decreases. In the case of a roundness at 0.65 or less, a corner of abrasive grains bites into a surface of the abrasive pad so that the abrasive grains are held on the abrasive pad, but because of the contact of the point and surface, sufficient contact area cannot be ensured, which results in no high grinding speed being obtained. Also, In the case of a roundness at 0.75 or more, especially at 0.85 or more, since abrasive grain shape is close to a sphere, the abrasive grains tend to roll on the abrasive pad without being held thereon, which results in no sufficient grinding speed being obtained. The roundness for obtaining sufficient grinding speed is in the range of 0.65 or more and 0.75 or less, which is considered to be a shape of the abrasive grains for being easily held on the abrasive pad, and for obtaining sufficient contact area.

In this manner, of abrasive grain characteristics (roundness, cohesion, average grain size, grain-size distribution), the most correlated characteristics with grinding characteristics (wafer shape, grinding speed) is roundness. Abrasive grain roundness and grinding characteristics, especially wafer shape and grinding speed largely affects each other.

Next, examples that a shape of abrasive grain affects the wafer shape and grinding speed most are shown. As the first example, there is shown an example that cohesion, average grain size, and grain-size distribution are the same, but roundness is different. In comparison of abrasive grains No. 2 of Example 1 with No. 11 of Comparative Example 11, looking at the change of grain-size distribution against dispersion time by the homogenizer shown in FIGS. 2 and 11, the cohesion and grain-size distribution are the same, and the average grain size is the same, as shown in Tables 3 and 7. However, by comparison of the roundness when the homogenizer is applied for 5 min, the roundness of abrasive grains No. 2 is 0.66, which was significantly different from the roundness of abrasive grains No. 11, 0.93. When ground by using an abrasive with abrasive grains No. 2, the wafer shape and grinding speed are good, as shown in Table 5, whereas, when ground by using abrasive grains No. 11, the wafer shape deteriorates and the grinding speed decreases.

As the second example, there is shown an example that roundness is the same, but cohesion, average grain size, and grain-size distribution are different. In comparison of abrasive grains Nos. 1 and 2 of Example 1, the roundness of abrasive grains Nos. 1 and 2 is the same, as shown in Table 3, but in view of Table 3, FIGS. 1 and 2, the cohesion, average grain size, and grain-size distribution of abrasive grains Nos. 1 and 2 are significantly different. In contrast, the grinding characteristics when ground by using abrasives with abrasive grains Nos. 1 and 2 both are good, as shown in Table 5.

Also, as mentioned above, since grinding characteristics vary according to roundness, the roundness can be used dependent on grinding characteristics required most in a manufacturing line. From the point of view of grinding characteristics, roundness is divided into the first range of 0.5 or more and less than 0.65, the second range of 0.65 or more and less than 0.75, the third range of 0.75 or more and less than 0.87, and the fourth range of 0.87 or more and less than 1.0. In the third range, peripheral dripping due to a subtle shape difference of abrasive grains occurs, but sufficient grinding speed may be obtained. From the above reason, however, abrasive grains exhibiting the roundness of the third and fourth ranges, the wafer shape tends to deteriorate and the grinding speed tends to decrease, which results in difficulty of use as the abrasive. The range of roundness that can be used as the abrasive is the first and second ranges.

A wafer when ground by using abrasive grains exhibiting the roundness of the first range can provide a stable shape without causing peripheral dripping. Also, as secondary effects, deterioration of wafer shape accompanied by change over time of the abrasive pad is controlled, so that the life of the abrasive pad becomes longer. As described above, however, abrasive grains Nos. 5-7 of Example 1 exhibiting the roundness of the first range cannot provide a sufficient contact area with the wafer, and in addition, since the cohesion between primary grains is strong so that they are not easily ground during grinding, no contact area with the wafer is obtained, so that the abrasive grains exhibiting the roundness of the first range cannot ensure sufficient grinding speed. For this reason, chemical concentration adjustment is required. By adjusting a chemical concentration of sodium tripolyphosphate of the abrasive as shown in Table 1, sufficient grinding speed can be obtained.

As an exception, an abrasive using abrasive grains No. 1 of Example 1 with the roundness of the first range provides a good wafer shape, and a sufficient grinding speed of more than 0.6 µm/min despite the low roundness 0.56. In this case, from the change of grain-size distribution against dispersion time of the homogenizer shown in FIG. 1, the cohesion of abrasive grains No. 1 is weak, and when the homogenizer is applied for 5 min, the average grain size is ground from 3.74 µm to 1.46 µm. For this reason, the abrasive grains being made fine make the contact area with the wafer larger, which is considered to result in sufficient grinding speed. As described above, the average grain size is also considered to be a factor which affects grinding characteristics, but because the factors of grain size and roundness cannot be separated, it cannot be clear.

Grinding characteristics when ground by using an abrasive using abrasive grains exhibiting the roundness of the second range can provide both good wafer shape and sufficient grinding speed. Abrasive grains exhibiting the roundness of the second range are most versatile. They are widely applied with less variation of grinding characteristics regardless of differences in grinding apparatus characteristics, abrasive pads, wafer shape before grinding, and so on. The wafer shape of an abrasive using abrasive grains exhibiting the roundness of the second range has a gentle inclination from a wafer peripheral portion to the center, compared with that of abrasive grains exhibiting the roundness of the first range, so that the wafer tends to cause peripheral dripping little by little with change over time of the abrasive pad. In this case, dependent on change over time of the abrasive pad, abrasive grains exhibiting the roundness of the first and second ranges are used appropriately, thereby allowing wafer shape to be maintained, which results in no loss of grinding speed, ensured stable wafer shape, and longer life of the abrasive pad.

In Example 1, grinding characteristics using abrasive grains No. 6 exhibiting the roundness of the first range provide good wafer shape, but grinding speed decreases by 10%, compared with abrasive grains exhibiting the roundness of the second range. Accordingly, using abrasive grains No. 3 exhibiting the roundness of the second range, the correlation of grinding speed and a concentration of sodium tripolyphosphate which has the effect of enhancing grinding speed most is examined.

Figure 17:
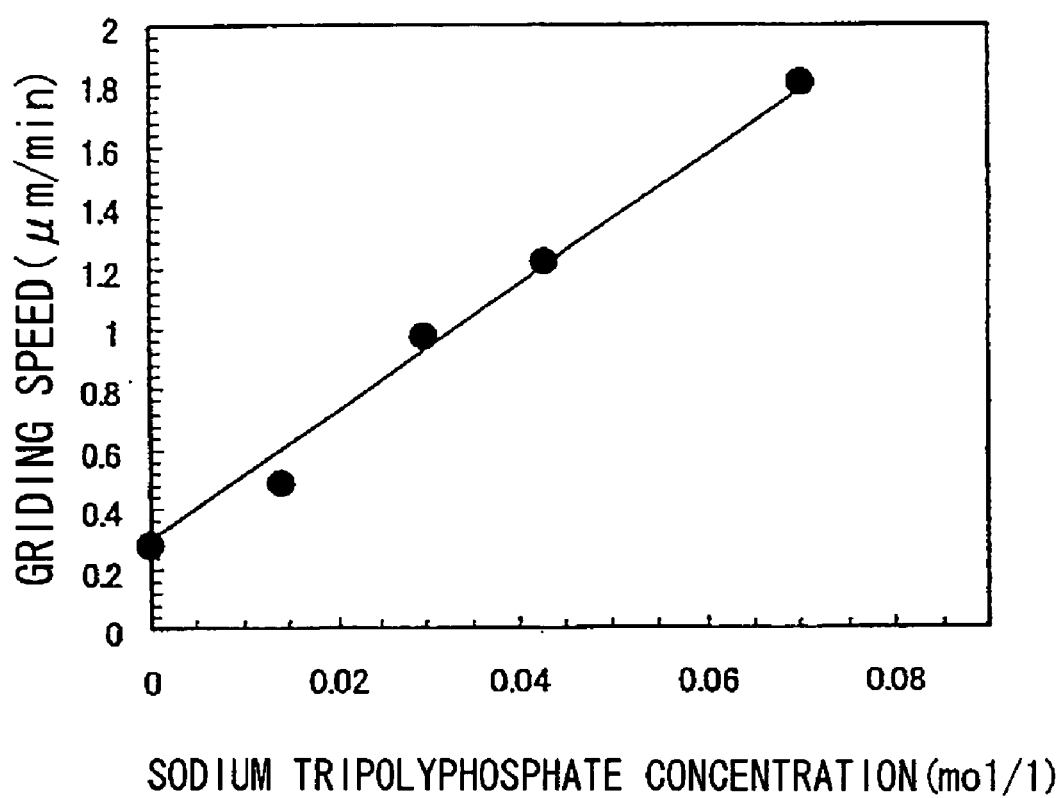
FIG. 17 is a graph showing effects of grinding speed on the concentration of sodium tripolyphosphate which is the abrasive content, when a GaAs wafer was ground by an abrasive using abrasive grains No. 3.

Five abrasives are prepared by changing the concentration of sodium tripolyphosphate, and then abrasive solution preparation and grinding are performed. Consequently, as shown in FIG. 17, it is found that, as the concentration of sodium tripolyphosphate becomes higher, the grinding speed becomes higher, and the effect is obtained up to an amount added about twice the concentration of sodium tripolyphosphate of Table 1.

After preparing the abrasive of Table 1, when an abrasive solution is prepared, the concentration of sodium tripolyphosphate is 0.03 mol/l. The amount added of sodium tripolyphosphate which has the effect is 0.014 mol/l or more and 0.07 mol/l and less. In the case of less than 0.014 mol/l, almost no effect is obtained, which results in no sufficient grinding speed. Also, in the case of exceeding 0.07 mol/l, haze occurred in a wafer surface, which could not be removed enough in the cleaning step. The amount added of sodium tripolyphosphate is preferably 0.025 mol/l or more and 0.05 mol/l or less, which can enhance grinding speed without being affected by the wafer even when the other chemical concentrations are made higher.

Using abrasive grains No. 6, abrasives are prepared in the four concentrations of sodium tripolyphosphate shown in Table 9, and then abrasive solution preparation and grinding are performed (The results are shown in Table 10).

TABLE 9

|   | sodium tripolyphosphate [mol/l] |
|---|---|
| 1 | 0.03 |
| 2 | 0.05 |
| 3 | 0.07 |
| 4 | 0.085 |

TABLE 10

|   | Grinding speed [μm/min] | Wafer shape (TTV) [μm] | Surface roughness (Pv)[nm] | Appearance |
|---|---|---|---|---|
| 1 | 0.55 or more | 1.3 | 3-5 | Very good |
| 2 | 0.60 or more | 1.4 | 3-5 | Very good |
| 3 | 0.63 or more | 1.4 | 3-5 | Very good |
| 4 | 0.67 or more | 1.3 | 3-5 | good |

The similar result to those using the above abrasive grains No. 3 is exhibited. By adding 0.05 mol/l of sodium tripolyphosphate, sufficient grinding speed is obtained. Also, for this reason, when abrasive grains exhibiting the roundness of the first range are used, by increasing the concentration of sodium tripolyphosphate within the above-described range, sufficient grinding speed and good wafer shape are obtained.

EXAMPLE 3

In order to grasp a life of abrasive pads, after an abrasive is prepared using abrasive grains No. 3 of Example 1, an abrasive solution is prepared, and grinding is performed in the same conditions as those of Example 1 (The results are shown in Table 11).

TABLE 11

| Silica (abrasive grains) | No. of cycles | Grinding speed [μm/min] | Wafer shape (TTV) [nm] | Surface roughness (Pv) [nm] | Appearance |
|---|---|---|---|---|---|
| No. 3 | 1 | 0.60 or more | 1.4 | 3-5 | Very good |
|  | 45 | 0.60 or more | 0.85 (peripheral dripping) | 3-5 | Very good |
| No. 6 | 46 | 0.58 or more | 1.3 | 4-6 | Very good |
|  | 95 | 0.57 or more | 1.1 | 4-6 | Good |

The result shows that the wafer shape varies little by little from 20 cycles, and at 45 cycles, peripheral dripping in the wafer is remarkable, while the measured value of TTV is 0.85. For this reason, after an abrasive is prepared using abrasive grains No. 6 so that the concentration of sodium tripolyphosphate is 0.05 mol/l in the same manner as Example 2, an abrasive solution is prepared, and grinding is performed in the same conditions as those of Example 1. The result shows that peripheral dripping in the wafer can be controlled. The grinding speed during it is the same as that using abrasive grains No. 3. Further grinding is performed continuously until 95 cycles, which then causes slight flaws and therefore is finished. Consequently, a life of the abrasive pad can be extended from 45 cycles to 95 cycles. Also, the grinding characteristics shows that slight flaws occurred at 95 cycles, but wafer shape and surface roughness both maintain 46-cycle grinding characteristics, and the grinding speed is also the same as first 46 cycles. In this manner, by using the abrasive grains appropriately, the grinding characteristics can be maintained, while a life of the abrasive pad can be extended twice.

EXAMPLE 4

This Example fabricates a semiconductor laser device with MQW (multi-quantum well) structure provided on a GaAs substrate as one example of a semiconductor device. Further, the form of a semiconductor device fabricated with the invention is not limited to the structure of this Example.

First, using the abrasive solution of Example 1 shown in Table 3, a surface of the (100)-plane GaAs substrate is ground and flatted. The grinding conditions are almost the same as those shown in Table 4: the grinding pressure is 3.5 kPa; the number of revolutions of the plate is about 74 rpm; the abrasive solution supply is 15 ml/min; and the grinding time is about 60 min.

Subsequently, grinding marks in the surface of the GaAs substrate are removed using a $H_3PO_4:H_2O$ etching solution according to needs. Thereafter, using MBE (molecular beam epitaxy), MOCVD (metal organic chemical vapor deposition), or the like, there are sequentially formed a first GaAlAs cladding layer (film thickness: about 0.5 μm), an MQW (multi-quantum well) active layer (film thickness: about 50 nm), a second GaAlAs cladding layer (film thickness: about 0.2 μm), and a GaAs current-limiting layer (film thickness: 3-5 μm). Further, the MQW active layer has GaAs (film thickness: 3 nm) and GaAlAs (film thickness: about 5 nm) layers formed alternately and sequentially therein. Subsequently, the GaAs current-limiting layer has an opening with a specified width (3-5 μm) provided in the (110)-plane so as to reach the second GaAlAs cladding layer. Subsequently, an electrode layer is formed in the opposite surface to the first GaAlAs cladding layer-side surface in the GaAs substrate. Subsequently, an electrode layer is formed in the opposite surface to the active layer-side surface in the second GaAlAs cladding layer and the GaAs current-limiting layer so as to fill in the above opening. And finally dicing is performed to obtain a semiconductor laser device.

As a result of examining characteristics of the semiconductor laser device, it is found that the linearity of current-light characteristics after oscillation is improved, and variations of important characteristics of the semiconductor laser device, such as oscillation threshold current, is improved, in comparison with the case where no flattening grinding of the GaAs substrate is performed.

Further, although the thickness of the first cladding layer is 0.5 μm in the above example, even when it is on the order of 0.1-0.2 μm, a similar result to the above example is exhibited. This is considered to be because, by flattening the GaAs substrate surface using the abrasive of the invention, effects on the extremely important MQW active layer of the laser device due to uneven surface of the GaAs substrate are reduced.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. Abrasive grains, comprising grains with a roundness of 0.50 or more and 0.75 or less, wherein the roundness is defined as a ratio of a circumference of a circle having the same area as that of a projected image of a grain to a perimeter of the projected image of the grain, wherein the roundness is determined after a medium containing the grains has been agitated to disperse the grains while being irradiated with ultrasound.

2. The abrasive grains according to claim 1, wherein: the roundness is 0.55 or more and 0.72 or less.

3. The abrasive grains according to claim 1, wherein: the grains comprise a plurality of aggregated primary grains, wherein an average grain size of each primary grain is 0.005 µm or more and 0.1 µm or less.

4. The abrasive grains according to claim 3, wherein: an average grain size of the aggregated primary grains is 1 µm or more and 30 µm or less.

5. The abrasive grains according to claim 3, wherein: an average grain size of the aggregated primary grains is 3 µm or more and 20 µm or less.

6. The abrasive grains according to claim 1, wherein the grains comprise fumed silica.

7. An abrasive, comprising:
abrasive grains that comprise grains with a roundness of 0.50 or more and 0.75 or less, wherein the roundness is defined as the ratio of the circumference of a circle having the same area as that of a projected image of a grain to a perimeter of the projected image of the grain, wherein the roundness is determined after a medium containing the grains has been agitated to disperse the grains while being irradiated with ultrasound; and
at least one of an oxidizer, an oxide solution, an abrasive grain dispersion agent and a basic compound.

8. The abrasive according to claim 7, wherein: the oxidizer is sodium dichloroisocyanurate, the oxide solution is sodium tripolyphosphate; the abrasive grain dispersion agent is sodium sulfate; and the basic compound is sodium carbonate or sodium hydroxide.

9. The abrasive according to claim 7, wherein the grains comprise fumed silica.

10. An abrasive solution, comprising:
abrasive grains that comprise grains with a roundness of 0.50 or more and 0.75 or less, wherein the roundness is defined as a ratio of a circumference of a circle having the same area as that of a projected image of a grain to a perimeter of the projected image of the grain, wherein the roundness is determined after a medium containing the grains has been agitated to disperse the grains while being irradiated with ultrasound; and
water or hydrophilic substance, wherein the water or hydrophilic substance is the medium containing the grains being agitated to disperse the grains while being irradiated with ultrasound.

11. The abrasive solution according to claim 10, wherein: the abrasive grain content is 10 wt % or more and 40 wt % or less when the total amount of the solid content in the abrasive solution is 100 wt %.

12. The abrasive solution according to claim 10, wherein: the abrasive grain content is 0.5 wt % or more and 5 wt % or less when the total amount of the abrasive solution is 100 wt %.

13. The abrasive solution according to claim 10, further comprising at least one of an oxidizer, an oxide solution, an abrasive grain dispersion agent and a basic compound.

14. The abrasive solution according to claim 13, wherein: the oxidizer is sodium dichloroisocyanurate; the oxide solution is sodium tripolyphosphate; the abrasive grain dispersion agent is sodium sulfate; and the basic compound is sodium carbonate or sodium hydroxide.

15. The abrasive solution according to claim 10, wherein: the abrasive solution is used for grinding group III-V compound semiconductor material or semiconductor material.

16. The abrasive solution according to claim 10 wherein the grains comprise fumed silica.

17. A method for preparing an abrasive solution, comprising the steps of:
adding an abrasive to a medium, wherein the abrasive comprises: abrasive grains that comprise grains; and at least one of an oxidizer, an oxide solution, an abrasive grain dispersion agent and a basic compound;
agitating the medium while irradiating it with ultrasound; and
determining the roundness of the grains after agitating the medium while irradiating it with ultrasound,
wherein the grains have a roundness of 0.50 or more and 0.75 or less, wherein the roundness is defined as a ratio of a circumference of a circle having the same area as that of a projected image of a grain to a perimeter of the projected image of the grain.

* * * * *